United States Patent
Mizokawa et al.

(10) Patent No.: US 9,159,600 B2
(45) Date of Patent: Oct. 13, 2015

(54) WAFER TRANSPORT APPARATUS

(71) Applicant: SINFONIA TECHNOLOGY CO., LTD., Tokyo (JP)

(72) Inventors: Takumi Mizokawa, Tokyo (JP); Yasuyoshi Kitazawa, Tokyo (JP)

(73) Assignee: SINFONIA TECHNOLOGY CO., LTD., Tokyo (JP)

(*) Notice: Subject to any disclaimer, the term of this patent is extended or adjusted under 35 U.S.C. 154(b) by 240 days.

(21) Appl. No.: 13/740,721

(22) Filed: Jan. 14, 2013

(65) Prior Publication Data

US 2013/0183122 A1 Jul. 18, 2013

(30) Foreign Application Priority Data

Jan. 13, 2012 (JP) ................................. 2012-004548

(51) Int. Cl.
*H01L 21/677* (2006.01)
*H01L 21/67* (2006.01)

(52) U.S. Cl.
CPC .... *H01L 21/67739* (2013.01); *H01L 21/67201* (2013.01)

(58) Field of Classification Search
CPC .................. H01L 21/67739; H01L 21/67201; H01L 21/677; H01L 21/67155; H01L 21/67178; H01L 21/67184; H01L 21/67196; H01L 21/67751; H01L 21/67748; H01L 21/67763; H01L 21/6779
USPC ........................ 414/217, 804, 805, 217.1, 940
See application file for complete search history.

(56) References Cited

U.S. PATENT DOCUMENTS

| | | | |
|---|---|---|---|
| 6,270,306 B1* | 8/2001 | Otwell et al. ............ | 414/222.13 |
| 6,494,670 B2* | 12/2002 | Kroeker ........................ | 414/805 |
| 6,672,864 B2* | 1/2004 | Wang et al. ....................... | 432/5 |
| 7,198,448 B2* | 4/2007 | Ozawa et al. .................. | 414/217 |
| 7,210,246 B2* | 5/2007 | van der Meulen .............. | 34/467 |
| 7,756,599 B2* | 7/2010 | Kudo et al. .................... | 700/121 |
| 2005/0103270 A1* | 5/2005 | Yoshida et al. ............... | 118/718 |
| 2005/0111938 A1* | 5/2005 | van der Meulen ............ | 414/217 |
| 2006/0182532 A1* | 8/2006 | Okada et al. .................. | 414/217 |
| 2009/0162170 A1* | 6/2009 | Yamagishi et al. ........... | 414/217 |
| 2012/0051872 A1* | 3/2012 | Ku et al. ..................... | 414/217.1 |

FOREIGN PATENT DOCUMENTS

JP        2003-318244 A     11/2003

* cited by examiner

*Primary Examiner* — Saul Rodriguez
*Assistant Examiner* — Lynn Schwenning
(74) *Attorney, Agent, or Firm* — Westerman, Hattori, Daniels & Adrian, LLP

(57) ABSTRACT

The wafer transport apparatus prevents contaminant deposited on an unprocessed wafer from adhering to a processed wafer. Carrying-in load port 2A is loaded with a FOUP 1 storing an unprocessed wafer W1. Carrying-in chamber 3A has a transport robot 4A which takes out the unprocessed wafer W1 from the FOUP 1. Carrying-in load lock 5A is accessed by the transport robot 4A from the carrying-in chamber 3A side. Carrying-out load port 2B is loaded with the FOUP 1 that can store a processed wafer W2. Carrying-out chamber 3B has a transport robot 4B which passes the processed wafer W2 to the FOUP 1. Carrying-out load lock 5B is accessed by the transport robot 4B from the carrying-out chamber 3B side. The carrying-in chamber 3A and carrying-out chamber 3B are separated from each other. The carrying-in load lock 5A and carrying-out load lock 5B are arranged on different stages.

4 Claims, 4 Drawing Sheets

WAFER TRANSPORT APPARATUS

BACKGROUND OF THE INVENTION

1. Field of the Invention

The present invention relates to a wafer transport apparatus arranged in a clean room and capable of transporting a wafer.

2. Description of the Related Art

In a semiconductor manufacturing process, wafers are processed in a clean room to improve yield and quality. However, today when the integration degree of elements is increasing, circuits are being miniaturized, and the size of wafers is increasing, management of a speck of dust in the whole clean room is becoming difficult from cost and technical viewpoints. For this reason, means for performing wafer transport and other processing, using a "mini-environment system" that improves the cleanliness of only a local space around a wafer instead of improving the cleanliness of the whole clean room, has recently been adopted. In the mini-environment system, a wafer in a storage container called a FOUP (Front-Opening Unified Pod) for transporting and retaining a wafer in a highly clean environment can be loaded into and unloaded from a wafer transport chamber through a load port.

In a state in which the FOUP is placed on the load port, a door section provided at the load port and a door provided at a back surface of the FOUP are simultaneously opened while the door section is in close contact with the door, and a wafer transport robot provided in the wafer transport chamber, such as an arm robot, can take out a wafer in the FOUP into the wafer transport chamber or store the wafer from the wafer transport chamber in the FOUP through the load port. The load port is arranged at a front surface of the wafer transport chamber. A wafer transported by the wafer transport robot from inside the FOUP into the wafer transport chamber through the load port. And the wafer is transported to a semiconductor processing chamber (semiconductor processing apparatus) which subjects wafers to a semiconductor process (e.g., processing and cleaning) via a load lock chamber arranged at a back surface of the wafer transport chamber. After being subjected to appropriate processing in the semiconductor processing chamber, the wafer is transported to the load lock chamber and wafer transport chamber in this order and is stored in the FOUP on the load port.

In order to improve the processing efficiency (throughput) of a wafer to undergo the above-described transport procedure, a technique is disclosed for arranging a plurality of load ports at a front surface of a wafer transport chamber, arranging in the wafer transport chamber one wafer transport robot capable of sliding in a direction in which the load ports are installed in parallel, and transporting a wafer between each load port and a semiconductor manufacturing apparatus (semiconductor processing chamber) by the wafer transport robot (see, e.g., Japanese Patent Laid-Open No. 2003-318244).

However, in the case of the configuration disclosed in Japanese Patent Laid-Open No. 2003-318244, both a wafer (unprocessed wafer) to be transported from one load port into a semiconductor processing chamber and a wafer (processed wafer) after predetermined processing to be transported from the semiconductor processing chamber to the other load port pass through a common wafer transport chamber. Accordingly, a contaminant such as residual gas deposited on the unprocessed wafer may adhere to the processed wafer or a FOUP to store the processed wafer in the wafer transport chamber. Additionally, a wafer transport robot sliding in the wafer transport chamber may stir a gaseous atmosphere in the wafer transport chamber, and the interior of the wafer transport chamber may be contaminated with the contaminant.

SUMMARY OF THE INVENTION

The present invention has been made with a focus on the above-described problems, and has as its main object to provide a wafer transport apparatus capable of preventing and inhibiting a contaminant deposited on an unprocessed wafer from adhering to a processed wafer or a FOUP to store the processed wafer.

That is, the present invention relates to a wafer transport apparatus for carrying an unprocessed wafer into a semiconductor manufacturing processing apparatus and carrying out a processed wafer from the semiconductor manufacturing processing apparatus. A wafer transport apparatus according to the present invention includes a carrying-in load port which can be loaded with a FOUP storing an unprocessed wafer, a carrying-in chamber placing the carrying-in load port arranged at a front surface and having an in-carrying-in-chamber wafer transport robot provided in an internal space which takes out the unprocessed wafer from the FOUP on the carrying-in load port, a carrying-in load lock which is arranged between the carrying-in chamber and the semiconductor manufacturing processing apparatus and can be accessed by the in-carrying-in-chamber wafer transport robot from the carrying-in chamber side, a carrying-out load port which can be loaded with a FOUP that can store a processed wafer, a carrying-out chamber placing the carrying-out load port at a front surface and having an in-carrying-out-chamber wafer transport robot provided in an internal space which passes the processed wafer to the FOUP on the carrying-out load port, and a carrying-out load lock which is arranged between the carrying-out chamber and the semiconductor manufacturing processing apparatus and can be accessed by the in-carrying-out-chamber wafer transport robot from the carrying-out chamber side. The carrying-in chamber and the carrying-out chamber are separated from each other by a partition, and the carrying-in load lock and the carrying-out load lock are vertically arranged at positions overlapping with each other on different stages.

With the above-described load ports, a path in which an unprocessed wafer is carried into a semiconductor manufacturing processing apparatus and a path in which a processed wafer is carried out from the semiconductor manufacturing processing apparatus can be formed in spaces separated from each other, and a contaminant deposited on an unprocessed wafer can be prevented and inhibited from adhering to a processed wafer or a FOUP to store a processed wafer. That is, in the wafer transport apparatus according to the present invention, a path in which the unprocessed wafer stored in the FOUP placed on the carrying-in load port is taken out by the in-carrying-in-chamber wafer transport robot into the carrying-in chamber and is transported to the carrying-in load lock and a path in which the processed wafer is taken out by the in-carrying-out-chamber wafer transport robot from the carrying-out load lock into the carrying-out chamber and is passed from the carrying-out chamber into the FOUP placed on the carrying-out load port are separately secured, and the carrying-in chamber and carrying-out chamber are separated from each other by the partition. This prevents a gaseous atmosphere in the carrying-out chamber from being contaminated with a gaseous atmosphere in the carrying-in chamber. Even if a contaminant is deposited on the unprocessed wafer in the carrying-in chamber, adhesion of the contaminant to the processed wafer in the carrying-out chamber or an interior of the FOUP placed on the carrying-out load port can be avoided.

Additionally, in the wafer transport apparatus according to the present invention, the carrying-in load lock and carrying-out load lock are arranged on stages in a height direction. This configuration allows reduction in the installation area for the carrying-in load lock and carrying-out load lock and achieves space saving, as compared to an aspect in which the carrying-in load lock and carrying-out load lock are arranged at positions not overlapping with each other in a plan view. The wafer transport apparatus according to the present invention can concurrently perform an operation of carrying the unprocessed wafer in the FOUP on the carrying-in load port into the carrying-in load lock by the in-carrying-in-chamber wafer transport robot and an operation of carrying out the processed wafer in the carrying-out load lock into the FOUP on the carrying-out load port by the in-carrying-out-chamber wafer transport robot. This contributes significantly to further improvement in the efficiency of wafer transport processing.

In particular, in the wafer transport apparatus according to the present invention, one including a wafer carrying-in port capable of communicating with a semiconductor processing chamber arranged at a back surface is employed as the carrying-in load lock, one including a wafer carrying-out port capable of communicating with the semiconductor processing chamber arranged at the back surface is employed as the carrying-out load lock, and the wafer carrying-in port and the wafer carrying-out port can be set to have the same orientation. With this configuration, a direction in which the carrying-in load lock is accessed from the semiconductor processing chamber side and a direction in which the carrying-out load lock is accessed from the semiconductor processing chamber side can be set to the same direction.

The wafer transport apparatus according to the present invention can also adopt a configuration which further includes the in-processing-chamber wafer transport robot arranged in the semiconductor processing chamber and in which the in-processing-chamber wafer transport robot is provided with an unprocessed wafer transport blade which can access an interior of the carrying-in load lock and the processed wafer transport blade which can access an interior of the carrying-out load lock. Adoption of the configuration makes it possible to concurrently perform a process of carrying the unprocessed wafer from the carrying-in load lock into the semiconductor manufacturing processing apparatus and a process of carrying out the processed wafer from the semiconductor manufacturing processing apparatus into the carrying-out load lock, which improves wafer transport capability. This configuration separately including the unprocessed wafer transport blade and the processed wafer transport blade can preferably prevent a contaminant deposited on the unprocessed wafer transport blade at the time of transporting the unprocessed wafer from adhering to the processed wafer at the time of transporting the processed wafer, as compared to a configuration in which a common blade is used as a blade for transporting an unprocessed wafer and a blade for transporting a processed wafer.

Moreover, if a purge station which can replace a gaseous atmosphere in the FOUP with nitrogen or dry air is arranged adjacent to one or both of the carrying-in chamber and the carrying-out chamber in the wafer transport apparatus according to the present invention, decontamination of one or both of the unprocessed wafer and the processed wafer can be performed more reliably.

In this case, by configuring the wafer transport apparatus to include purge station heating means for warming the wafer transported to the purge station, a contaminant can be appropriately liberated from a wafer by a thermal phoresis phenomenon. A configuration in which the purge station heating means warms only a part where a wafer is placed can be adopted as a configuration of the purge station heating means, in addition to a configuration in which the purge station heating means warms the whole purge station.

For substantially the same reason, the wafer transport apparatus can also be configured to include wafer transport robot heating means for warming at least one of the in-carrying-in-chamber wafer transport robot and the in-carrying-out-chamber wafer transport robot. In this case, a configuration in which only a part where a wafer is directly placed is warmed can be adopted as a configuration of the wafer transport robot heating means, in addition to a configuration in which the whole wafer transport robot is warmed.

According to the present invention, a path in which an unprocessed wafer is carried into a semiconductor manufacturing processing apparatus and a path in which a processed wafer is carried out from the semiconductor manufacturing processing apparatus can be separated from each other. This allows provision of a wafer transport apparatus which is capable of preventing and inhibiting a contaminant deposited on an unprocessed wafer from adhering to a processed wafer or a FOUP to store the processed wafer and has achieved improved wafer-transporting capability.

DESCRIPTION OF EMBODIMENTS

In the following, an embodiment of the preset invention is described with reference to the accompanying drawing.

Figure 1:
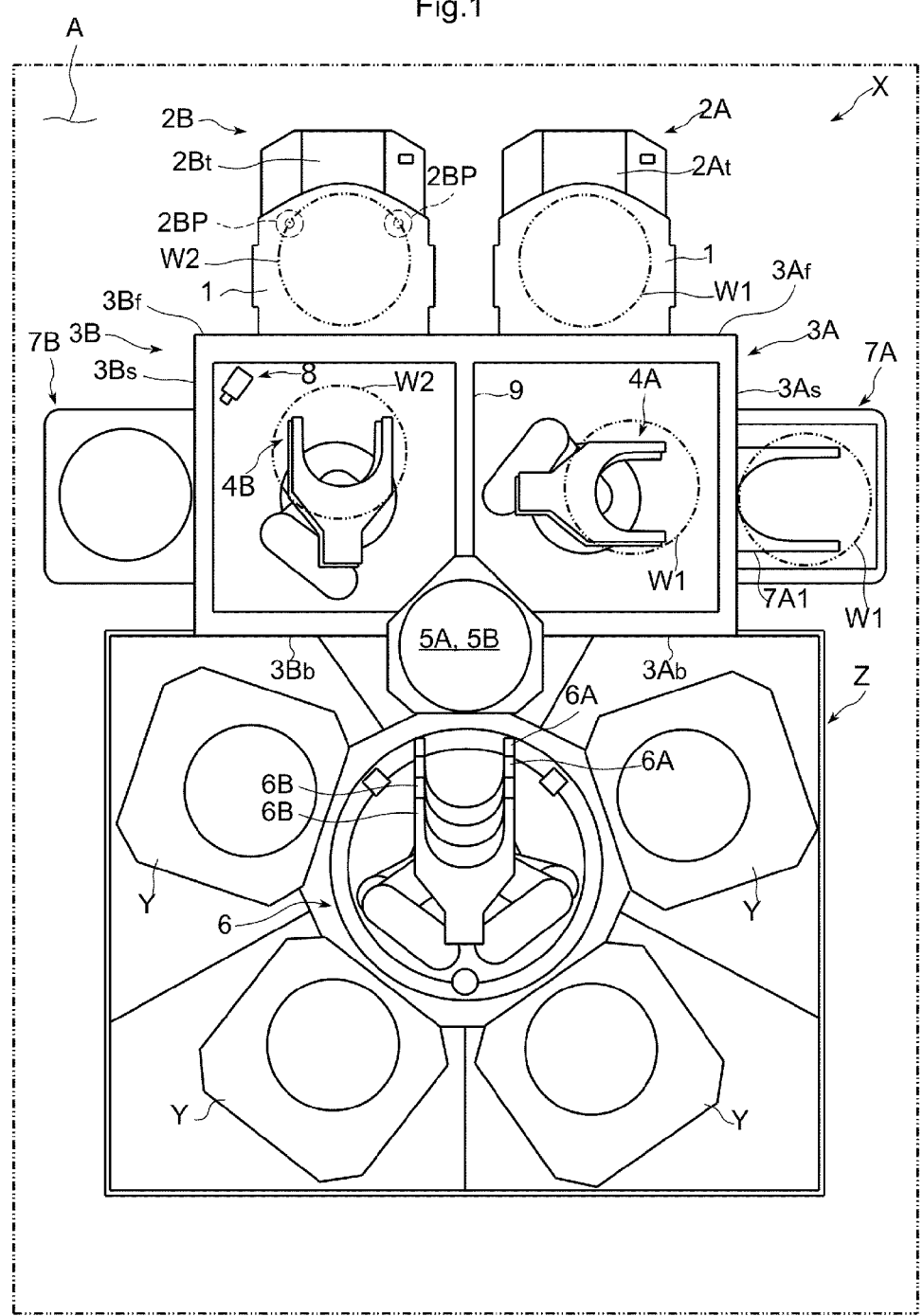
FIG. 1 is a plan view schematically showing a relative positional relationship between a wafer transport apparatus and a semiconductor manufacturing processing apparatus according to one embodiment of the present invention.

As shown in FIG. 1, a wafer transport apparatus X according to the present embodiment is used, for example, in a semiconductor manufacturing process and is capable of carrying a wafer stored in a FOUP 1 into a semiconductor manufacturing processing apparatus Y (hereinafter also referred to as a "wafer processing apparatus Y") and carrying out a wafer processed by the wafer processing apparatus Y into the FOUP 1.

As shown in FIG. 1, the wafer transport apparatus X according to the present embodiment includes a carrying-in load port 2A which can be loaded with the FOUP 1 storing a wafer before processing (hereinafter referred to as an "unprocessed wafer W1"), a carrying-in chamber 3A having a front surface 3Af at which the carrying-in load port 2A is arranged, an in-carrying-in-chamber wafer transport robot 4A which is provided in the carrying-in chamber 3A, a carrying-in load lock 5A which the in-carrying-in-chamber wafer transport robot 4A can access, a carrying-out load port 2B which can be loaded with the FOUP 1 that can store a processed wafer W2, a carrying-out chamber 3B having a front surface 3Bf at which the carrying-out load port 2B is arranged, an in-carrying-out-chamber wafer transport robot 4B which is provided in the carrying-out chamber 3B, a carrying-out load lock 5B which the in-carrying-out-chamber wafer transport robot 4B can access, and an in-processing-chamber wafer transport robot 6 having an unprocessed wafer transport blade 6A which is provided in a semiconductor processing chamber Z (hereinafter referred to as a "wafer processing chamber Z") where the wafer processing apparatuses Y are arranged and can access the carrying-in load lock 5A and a processed wafer transport blade 6B which is provided in the wafer processing chamber Z and can access the carrying-out load lock 5B. The wafer transport apparatus X and semiconductor manufacturing processing apparatuses Y (wafer processing chamber Z) are arranged in a common clean room A. Note that the unprocessed wafer W1 and processed wafer W2 are indicated by imaginary lines (chain double-dashed lines) in FIG. 1.

The FOUP 1 is a known one having a wafer storage space which can store a plurality of wafers in a multistage manner in a height direction and including a door which can open/close the wafer storage space, and a detailed description thereof will be omitted. Note that a flange section which can be grasped by a FOUP transport apparatus such as an OHT (Overhead Hoist Transfer) may be provided on an upper surface of the FOUP 1 or handles may be provided on two side surfaces.

The carrying-in load port 2A is arranged at the front surface 3Af of the carrying-in chamber 3A and is used to open/close the door of the FOUP 1 while in close contact with the door and take out the unprocessed wafer W1 from inside the FOUP 1 into the carrying-in chamber 3A through the front surface 3Af of the carrying-in chamber 3A. The carrying-out load port 2B is used to open/close the door of the FOUP 1 while in close contact with the door and pass the processed wafer W2 from the carrying-out chamber 3B into the FOUP 1 through the front surface 3Bf of the carrying-out chamber 3B. Known load ports can be used as the carrying-in load port 2A and carrying-out load port 2B. The load ports (the carrying-in load port 2A and carrying-out load port 2B) include placement tables 2At and 2Bt on which the FOUP 1 is to be placed, frames which are arranged in a substantially vertical posture while supporting the placement tables 2At and 2Bt, openings of the frames which have bottom edges set to be substantially level with upper surfaces of the placement tables 2At and 2Bt and can communicate with the carrying-in chamber 3A and carrying-out chamber 3B, and door sections which open/close the openings. The frames, opening, and door sections are omitted in FIG. 1 and the like. The carrying-out load port 2B according to the present embodiment includes bottom purge sections 2BP (see FIG. 1) which purge the FOUP 1 placed on the placement table 2Bt of the carrying-out load port 2B.

In the present embodiment, the carrying-in chamber 3A and carrying-out chamber 3B of the same size having internal spaces separated from each other are arranged in a width direction of the wafer transport apparatus X, the carrying-in load port 2A is arranged at the front surface 3Af of the carrying-in chamber 3A, and the carrying-out load port 2B is arranged at the front surface 3Bf of the carrying-out chamber 3B. As a result, the carrying-in load port 2A and carrying-out load port 2B are arranged in the width direction of the wafer transport apparatus X. Thus, the FOUP 1 transported by a FOUP transport apparatus (not shown) operating on a straight transport line (line of flow) extending along the front surfaces 3Af and 3Bf of the carrying-in chamber 3A and carrying-out chamber 3B can be passed to and from the load ports (the carrying-in load port 2A and carrying-out load port 2B). Note that a plurality of carrying-in load ports 2A and a plurality of carrying-out load ports 2B may be arranged at the front surfaces 3Af and 3Bf of the carrying-in chamber 3A and carrying-out chamber 3B, respectively.

The carrying-in load port 2A and carrying-out load port 2B together with the carrying-in chamber 3A and carrying-out chamber 3B constitute an EFEM (Equipment Front End Module). The wafer processing chamber Z where the wafer processing apparatuses Y are arranged is provided at back surfaces 3Ab and 3Bb of the carrying-in chamber 3A and carrying-out chamber 3B. In the clean room A, it is kept highly clean in the carrying-in chamber 3A, carrying-out chamber 3B, wafer processing chamber Z, and FOUP 1 while it is less clean in a space where the carrying-in load port 2A and carrying-out load port 2B are arranged, i.e., outside the carrying-in chamber 3A, carrying-out chamber 3B, wafer processing chamber Z, and FOUP 1.

FIG. 1 schematically shows, as a plan view of the carrying-in load port 2A, the carrying-out load port 2B, and their surroundings as seen from above, a relative positional relationship among the sections and chambers constituting the wafer transport apparatus X in the clean room A and schematically shows a relative positional relationship among the wafer transport apparatus X according to the present embodiment including the EFEM composed of the carrying-in load port 2A, carrying-out load port 2B, carrying-in chamber 3A, and carrying-out chamber 3B and the wafer processing apparatuses Y.

As shown in FIG. 1, the in-carrying-in-chamber wafer transport robot 4A that carries the unprocessed wafer W1 in the FOUP 1 on the carrying-in load port 2A into the wafer processing apparatus Y is arranged in the carrying-in chamber 3A, and the in-carrying-out-chamber wafer transport robot 4B that can carry out the processed wafer W2 subjected to appropriate processing in the wafer processing apparatus Y into the FOUP 1 on the carrying-out load port 2B is arranged in the carrying-out chamber 3B. In the present embodiment, the in-carrying-in-chamber wafer transport robot 4A and in-carrying-out-chamber wafer transport robot 4B having the same structure are employed. More specifically, one including a blade (arm hand section) capable of transporting a wafer placed thereon can be employed as each wafer transport robot (the in-carrying-in-chamber wafer transport robot 4A or in-carrying-out-chamber wafer transport robot 4B), and a single-arm type one including a multi-blade capable of transporting a plurality of wafers at one time (a double-blade capable of transporting two wafers at one time in the shown example) is employed in the present embodiment. It is, of course, also possible to employ a wafer transport robot capable of transporting one wafer at one time. The wafer transport apparatus X according to the present embodiment includes wafer transport robot heating means (not shown) for warming the in-carrying-in-chamber wafer transport robot 4A and wafer transport robot heating means (not shown) for warming the in-carrying-out-chamber wafer transport robot 4B. Each wafer transport robot heating means is implemented by, for example, directly providing a heater such as a hot wire at a portion of the wafer transport robot 4A or 4B where a wafer can be placed.

In the wafer transport apparatus X according to the present embodiment, a pre-processing purge station 7A which purges the unprocessed wafer W1 transferred by the in-carrying-in-chamber wafer transport robot 4A from the FOUP 1 on the carrying-in load port 2A to the carrying-in chamber 3A is provided adjacent to a side surface 3As on the side farther from the carrying-out chamber 3B of two side surfaces of the carrying-in chamber 3A. The pre-processing purge station 7A is set so as to perform purging that removes gas by, for example, supplying CDA (Clean Dry Air) into a space to replace gas which can remain in the space with CDA (Clean Dry Air). In particular, the wafer transport apparatus X according to the present embodiment includes pre-processing purge station heating means for warming the unprocessed wafer W1 transported into the pre-processing purge station 7A to allow liberation (removal) of a contaminant such as residual gas deposited on the unprocessed wafer W1 transferred from the carrying-in chamber 3A into the pre-processing purge station 7A by a thermal phoresis phenomenon. In the present embodiment, the pre-processing purge station heating means is implemented by providing a hot wire (not shown) at a part of a wafer placement rack 7A1 which is arranged in the pre-processing purge station 7A. Note that chemical filters are installed on a ceiling and a floor surface (bottom surface), respectively, of the pre-processing purge station 7A.

In the wafer transport apparatus X according to the present embodiment, a post-processing purge station 7B which purges the processed wafer W2 transferred by the in-carrying-out-chamber wafer transport robot 4B from the carrying-out load lock 5B (to be described later) to the carrying-out chamber 3B is provided adjacent to a side surface 3Bs on the side farther from the carrying-in chamber 3A of two side surfaces of the carrying-out chamber 3B. The post-processing purge station 7B is set so as to perform purging that removes gas by, for example, supplying nitrogen as an inert gas into a space to replace gas remaining in the space with nitrogen. In the present embodiment, an ionizer 8 (static eliminator) is provided in the carrying-out chamber 3B. The ionizer 8 is configured to blow ionized air onto the processed wafer W2 passing through an access opening between the carrying-out chamber 3B and the post-processing purge station 7B (e.g., a slit formed in a shutter arranged at a boundary between the post-processing purge station 7B and the carrying-out chamber 3B) by a photoirradiation method using, e.g., soft X rays. Note that chemical filters are installed on a ceiling and a floor surface (bottom surface), respectively, of the post-processing purge station 7B.

Figure 2:
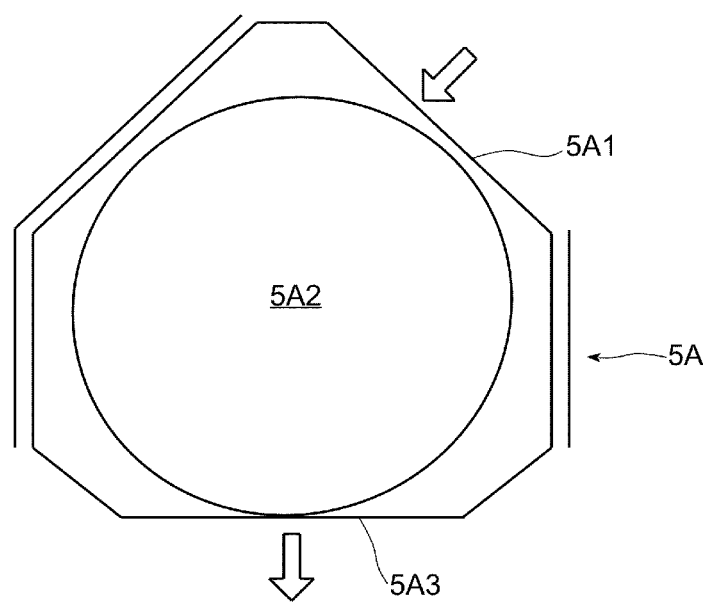
FIG. 2 is a schematic view of a carrying-in load lock according to the embodiment.

As shown in FIGS. 1 and 2 (FIG. 2 is a schematic enlarged view of the carrying-in load lock 5A), the carrying-in load lock 5A is arranged between the carrying-in chamber 3A and the semiconductor manufacturing processing apparatus Y and has a carrying-in chamber side opening 5A1 which the in-carrying-in-chamber wafer transport robot 4A can access from the carrying-in chamber 3A side. The carrying-in chamber side opening 5A1 faces only the carrying-in chamber 3A and does not face the carrying-out chamber 3B. Note that walls separating internal and external spaces of the carrying-in load lock 5A are schematically indicated by double lines in FIG. 2 and that a direction in which the unprocessed wafer W1 is transported via the carrying-in load lock 5A is indicated by arrows. The carrying-in load lock 5A includes (two in the present embodiment) carrying-in load lock stages 5A2, the number of which corresponds to the number of wafers that can be transported by the in-carrying-in-chamber wafer transport robot 4A. The carrying-in load lock 5A also has an unprocessed wafer carrying-in opening 5A3 (corresponding to a "wafer carrying-in port" according to the present invention) which the unprocessed wafer transport blade 6A of the in-processing-chamber wafer transport robot 6 arranged in the wafer processing chamber Z can access from the wafer processing chamber Z side. The unprocessed wafer carrying-in opening 5A3 is formed at a position facing only the interior of the wafer processing chamber Z. Note that the carrying-in chamber side opening 5A1 and unprocessed wafer carrying-in opening 5A3 may be each configured to be openable/closable by a shutter and may be set such that the shutters are opened to open the carrying-in chamber side opening 5A1 and unprocessed wafer carrying-in opening 5A3 only when the in-carrying-in-chamber wafer transport robot 4A and unprocessed wafer transport blade 6A access the interior of the carrying-in load lock 5A.

Figure 3:
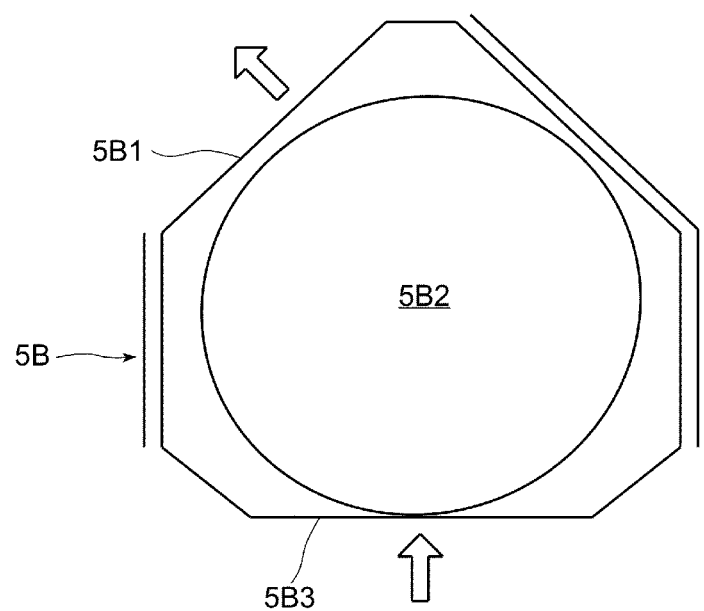
FIG. 3 is a schematic view of a carrying-out load lock according to the embodiment.

As shown in FIGS. 1 and 3 (FIG. 3 is a schematic enlarged view of the carrying-out load lock 5B), the carrying-out load lock 5B is arranged between the carrying-out chamber 3B and the semiconductor manufacturing processing apparatus Y and has a carrying-out chamber side opening 5B1 which the in-carrying-out-chamber wafer transport robot 4B can access from the carrying-out chamber 3B side. The carrying-out chamber side opening 5B1 faces only the carrying-out chamber 3B and does not face the carrying-in chamber 3A. Note that walls separating internal and external spaces of the carrying-out load lock 5B are schematically indicated by double lines in FIG. 3 and that a direction in which the processed wafer W2 is transported via the carrying-out load lock 5B is indicated by arrows. The carrying-out load lock 5B includes carrying-out load lock stages 5B2 (two in the present embodiment), the number of which corresponds to the number of wafers that can be transported by the in-carrying-out-chamber wafer transport robot 4B. The carrying-out load lock 5B also has a processed wafer carrying-out opening 5B3 (corresponding to a "wafer carrying-out port" according to the present invention) which the processed wafer transport blade 6B of the in-processing-chamber wafer transport robot 6 arranged in the wafer processing chamber Z can access from the wafer processing chamber Z side. The processed wafer carrying-out opening 5B3 is formed at a position facing only the interior of the wafer processing chamber Z. Note that the carrying-out chamber side opening 5B1 and processed wafer carrying-out opening 5B3 may be each configured to be openable/closable by a shutter and may be set such that the shutters are opened to open the carrying-out chamber side opening 5B1 and processed wafer carrying-out opening 5B3 only when the in-carrying-out-chamber wafer transport robot 4B and processed wafer transport blade 6B access the interior of the carrying-out load lock 5B. Internal spaces of the carrying-in load port 2A, carrying-out load port 2B, and wafer processing chamber Z are set to be capable of being evacuated.

As schematically shown in FIG. 1, in the wafer transport apparatus X according to the present embodiment, the carrying-in load lock 5A and carrying-out load lock 5B are arranged on stages at positions overlapping with each other in a plan view. Which one of the carrying-in load lock 5A and the carrying-out load lock 5B to arrange on the upper side can be determined on the basis of the type of a contaminant (e.g., whether the contaminant is likely to float). In the present embodiment, the carrying-in load lock 5A is arranged higher than the carrying-out load lock 5B. As shown in FIG. 1 and the other FIGS, a center in a width direction of the vertically stacked carrying-in load lock 5A and carrying-out load lock 5B is substantially collinear with a common partition 9 separating the carrying-in chamber 3A and carrying-out chamber 3B from each other. Of the carrying-in load lock 5A and carrying-out load lock 5B, rear half regions having the unprocessed wafer carrying-in opening 5A3 and processed wafer carrying-out opening 5B3 formed at positions facing only the wafer processing chamber Z can be recognized to be arranged in the wafer processing chamber Z.

As shown in FIG. 1, the in-processing-chamber wafer transport robot 6 includes the unprocessed wafer transport blade 6A that can take out the unprocessed wafer W1 transported to the carrying-in load lock 5A through the unprocessed wafer carrying-in opening 5A3 and carry the unprocessed wafer W1 into the wafer processing apparatus Y and the processed wafer transport blade 6B that can receive the processed wafer W2 subjected to appropriate processing by the wafer processing apparatus Y from the wafer processing apparatus Y and carry out the processed wafer W2 into the carrying-out load lock 5B through the processed wafer carrying-out opening 5B3. As the in-processing-chamber wafer transport robot 6, one including one unprocessed wafer transport blade 6A and one processed wafer transport blade 6B can be employed. The present embodiment, however, employs the in-processing-chamber wafer transport robot 6 including a plurality of unprocessed wafer transport blades 6A (two in the shown example) capable of separately transporting the unprocessed wafers W1 and a plurality of processed wafer transport blades 6B (two in the shown example) capable of separately transporting the processed wafers W2.

Note that a plurality of appropriate wafer processing apparatuses Y (four in the shown example) capable of simultaneously processing a plurality of wafers are arranged in the wafer processing chamber Z, as shown in FIG. 1.

In the following, an usage of wafer transport apparatus X according to the present embodiment is described.

Figure 4:
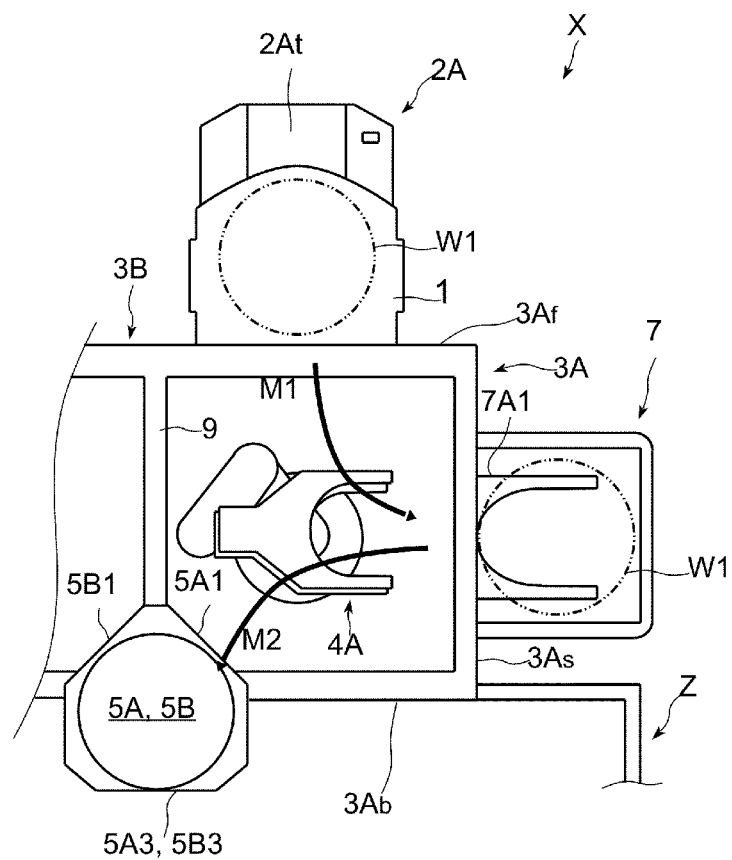
FIG. 4 is a schematic view showing a part of a path in which an unprocessed wafer is transported by the wafer transport apparatus according to the embodiment.

First, the wafer transport apparatus X according to the present embodiment receives, on the carrying-in load port 2A, the FOUP 1 transported along, e.g., a straight transport line by the FOUP transport apparatus and performs a process of sequentially expelling wafers in the FOUP 1 placed on the carrying-in load port 2A into the carrying-in chamber 3A via the opening in the carrying-in load port 2A, as shown in FIG. 4. The expelling process is a process of shifting the door section of the carrying-in load port 2A from a closed state to an opened state while the door section is in close contact with the door of the FOUP 1 and placing the unprocessed wafer W1 in the FOUP 1 onto a blade of the in-carrying-in-chamber wafer transport robot 4A and expelling the unprocessed wafer W1 from the FOUP 1 into the carrying-in chamber 3A while the opening in the frame is open.

As indicated by an arrow M1 in FIG. 4, the wafer transport apparatus X according to the present embodiment transfers the unprocessed wafer W1 from the carrying-in chamber 3A to the pre-processing purge station 7A by the in-carrying-in-chamber wafer transport robot 4A in the carrying-in chamber 3A, and performs purging (primary purging) in the pre-processing purge station 7A. When the in-carrying-in-chamber wafer transport robot 4A transfers the unprocessed wafer W1 from the carrying-in chamber 3A to the pre-processing purge station 7A, the wafer transport apparatus X according to the present embodiment can remove a contaminant deposited on the unprocessed wafer W1 or can make the contaminant easier to remove by warming the unprocessed wafer W1 on the in-carrying-in-chamber wafer transport robot 4A by the wafer transport robot heating means mounted on the in-carrying-in-chamber wafer transport robot 4A. Additionally, in the present embodiment, a contaminant deposited on the unprocessed wafer W1 transferred to the wafer placement rack 7A1 in the pre-processing purge station 7A can be removed by warming the unprocessed wafer W1 by the pre-processing purge station heating means at the time of the primary purging, combined with the primary purging. Note that the pre-processing purge station 7A is appropriately evacuated.

Subsequently to the primary purging, as indicated by an arrow M1 in FIG. 4, the wafer transport apparatus X according to the present embodiment transfers the unprocessed wafer W1 from the pre-processing purge station 7A to the carrying-in load lock 5A by the in-carrying-in-chamber wafer transport robot 4A. Even if a contaminant is deposited on the unprocessed wafer W1 at this time, the carrying-in load lock 5A is spatially separated from the carrying-out chamber 3B, to which the processed wafer W2 is to be transported, and the contaminant can be prevented from entering the carrying-out chamber 3B.

The wafer transport apparatus X according to the present embodiment transfers the unprocessed wafer W1 in the carrying-in load lock 5A into the wafer processing chamber Z by the unprocessed wafer transport blade 6A of the in-processing-chamber wafer transport robot 6 arranged in the wafer processing chamber Z and directly carries (passes) the unprocessed wafer W1 into the wafer processing apparatus Y. The unprocessed wafer transport blade 6A accesses the carrying-in load lock 5A through the unprocessed wafer carrying-in opening 5A3.

The wafer transport apparatus X according to the present embodiment transfers the processed wafer W2 subjected to predetermined processing in the wafer processing apparatus Y from the wafer processing chamber Z to the carrying-out load lock 5B by the processed wafer transport blade 6B of the in-processing-chamber wafer transport robot 6. The processed wafer transport blade 6B accesses the carrying-out load lock 5B through the processed wafer carrying-out opening 5B3.

The wafer transport apparatus X according to the present embodiment transfers the processed wafer W2 transported to the carrying-out load lock 5B into the carrying-out chamber 3B by the in-carrying-out-chamber wafer transport robot 4B. In the present embodiment, as indicated by an arrow M3 in FIG. 5, the wafer transport apparatus X transports the processed wafer W2 from the carrying-out load lock 5B to the post-processing purge station 7B by the in-carrying-out-chamber wafer transport robot 4B and performs purging (secondary purging) in the post-processing purge station 7B. When the in-carrying-out-chamber wafer transport robot 4B transfers the processed wafer W2 from the carrying-out chamber 3B to the post-processing purge station 7B, the wafer transport apparatus X according to the present embodiment can remove a contaminant deposited on the processed wafer W2 or can make the contaminant easier to remove by warming the processed wafer W2 on the in-carrying-out-chamber wafer transport robot 4B by the wafer transport robot heating means mounted on the in-carrying-out-chamber wafer transport robot 4B. Additionally, in the present embodiment, static electricity charged in the processed wafer W2 can be neutralized and removed by blowing ionized air with the ionizer 8 provided in the carrying-out chamber 3B onto the processed wafer W2 at the same time as or at a different time from the secondary purging, combined with the secondary purging. Note that the post-processing purge station 7B is also appropriately evacuated.

Figure 5:
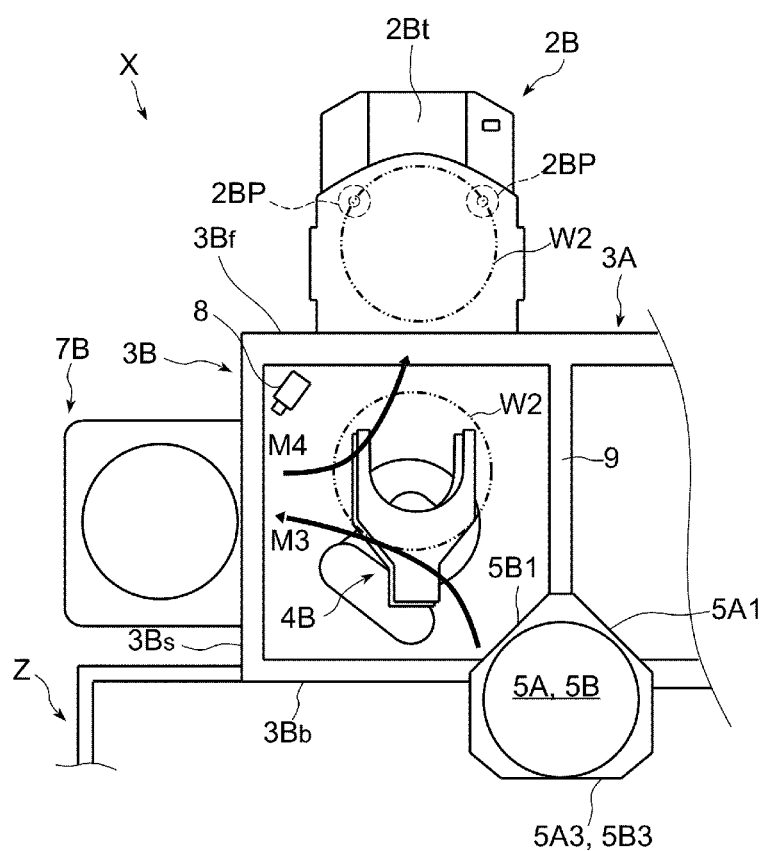
FIG. 5 is a schematic view showing a part of a path in which a processed wafer is transported by the wafer transport apparatus according to the embodiment.

Subsequently to the secondary purging, as indicated by an arrow M4 in FIG. 5, the wafer transport apparatus X according to the present embodiment transfers the processed wafer W2 from the post-processing purge station 7B to the FOUP 1 on the carrying-out load port 2B via the carrying-out chamber 3B by the in-carrying-out-chamber wafer transport robot 4B and stores the processed wafer W2 in the FOUP 1. In the present embodiment, the bottom purge sections 2BP are provided on the carrying-out load port 2B, and FOUP purging that replaces a gaseous atmosphere in the FOUP 1 on the carrying-out load port 2B with nitrogen or CDA can be performed. Additionally, the present embodiment distinguishes the FOUP 1 placed on the carrying-in load port 2A from the FOUP 1 placed on the carrying-out load port 2B and regulates transfer of the FOUP 1 placed on the carrying-in load port 2A to the carrying-out load port 2B. As a result, a situation never occurs in which a contaminant deposited on the unprocessed wafer W1 remains in the FOUP 1 placed on the carrying-out load port 2B.

At a time when the wafer transport apparatus X according to the present embodiment finishes storing an allowable number of processed wafers W2 in the FOUP 1 on the carrying-out load port 2B, the wafer transport apparatus X shifts the door section of the carrying-out load port 2B from an opened state to a closed state while the door section is in close contact with the door of the FOUP 1 and passes the FOUP 1 with the closed door to the FOUP transport apparatus on the transport line.

As described above, the wafer transport apparatus X according to the present embodiment separately secures a path in which the unprocessed wafer W1 stored in the FOUP 1 placed on the carrying-in load port 2A is taken out into the carrying-in chamber 3A by the in-carrying-in-chamber wafer transport robot 4A and is transported to the carrying-in load lock 5A and a path in which the processed wafer W2 is taken out from the carrying-out load lock 5B into the carrying-out chamber 3B by the in-carrying-out-chamber wafer transport robot 4B and is passed from the carrying-out chamber 3B into the FOUP 1 placed on the carrying-out load port 2B, and the carrying-in chamber 3A and carrying-out chamber 3B are separated from each other by the partition 9. This prevents a contaminant in the carrying-in chamber 3A from flowing into the carrying-out chamber 3B and a contaminant deposited on the unprocessed wafer W1 from adhering to the processed wafer W2 in the carrying-out chamber 3B or the interior of the FOUP 1 on the carrying-out load port 2B.

Additionally, in the wafer transport apparatus X according to the present embodiment, the carrying-in load lock 5A and carrying-out load lock 5B are arranged in a height direction. This configuration allows reduction in the installation area for the carrying-in load lock 5A and carrying-out load lock 5B and securement of access paths of the wafers W1 and W2 between the carrying-in chamber 3A and carrying-out chamber 3B and the wafer processing chamber Z through effective utilization of space in the height direction, as compared to an aspect in which the carrying-in load lock 5A and carrying-out load lock 5B are arranged at positions not overlapping with each other in a plan view. Thus, the wafer transport apparatus X according to the present embodiment can concurrently perform an operation of carrying the unprocessed wafer W1 in the carrying-in chamber 3A into the carrying-in load lock 5A by the in-carrying-in-chamber wafer transport robot 4A and an operation of carrying out the processed wafer W2 in the carrying-out load lock 5B into the carrying-out chamber 3B by the in-carrying-out-chamber wafer transport robot 4B and can concurrently perform an operation of carrying the unprocessed wafer W1 in the carrying-in load lock 5A into the wafer processing apparatus Y by the unprocessed wafer transport blade 6A and an operation of carrying out the processed wafer W2 from the wafer processing apparatus Y into the carrying-out load lock 5B by the processed wafer transport blade 6B. This provides further improvement in the efficiency of water transport processing.

In particular, in the wafer transport apparatus X according to the present embodiment, the unprocessed wafer carrying-in opening 5A3 formed in the carrying-in load lock 5A and capable of communicating with the wafer processing chamber Z and the processed wafer carrying-out opening 5B3 formed in the carrying-out load lock 5B and capable of communicating with the wafer processing chamber Z are set to have the same orientation. For this reason, as shown in FIGS. 2 and 3, a direction in which the unprocessed wafer transport blade 6A accesses the carrying-in load lock 5A from the wafer processing chamber Z side and a direction in which the processed wafer transport blade 6B accesses the carrying-out load lock 5B from the wafer processing chamber Z side can be set to be the same.

Moreover, in the wafer transport apparatus X according to the present embodiment, the in-processing-chamber wafer transport robot 6 is arranged in the wafer processing chamber Z, and the unprocessed wafer transport blade 6A that can access the interior of the carrying-in load lock 5A and the processed wafer transport blade 6B that can access the interior of the carrying-out load lock 5B are separately provided at the in-processing-chamber wafer transport robot 6. Accordingly, even if a contaminant is deposited on the unprocessed wafer transport blade 6A at the time of transporting the unprocessed wafer W1, not the unprocessed wafer transport blade 6A with the deposited contaminant but the processed wafer transport blade 6B specialized for carrying-out carries out the processed wafer W2. This avoids a situation in which the contaminant deposited on the unprocessed wafer transport blade 6A adheres to the processed wafer W2.

Furthermore, in the wafer transport apparatus X according to the present embodiment, since the pre-processing purge station 7A is arranged adjacent to the carrying-in chamber 3A, and the post-processing purge station 7B is arranged adjacent to the carrying-out chamber 3B, decontamination of the unprocessed wafer W1 or processed wafer W2 can be performed more reliably. In addition, the wafer transport apparatus X according to the present embodiment includes the purge station heating means for warming the internal space of the pre-processing purge station 7A, and a contaminant can be appropriately liberated from the unprocessed wafer W1 in the pre-processing purge station 7A by a thermal phoresis phenomenon.

Note that the present invention is not limited to the above-described embodiment. For example, a wafer transport apparatus may include post-processing purge station heating means for warming a processed wafer transported into a post-processing purge station. In the case of the wafer transport apparatus, even if a slight amount of a contaminant such as residual gas is deposited on a processed wafer transferred from a carrying-out chamber into the post-processing purge station, it is possible to induce a thermal phoresis phenomenon of the residual gas or the like by the post-processing station heating means and liberate (remove) the contaminant on the wafer. Note that a configuration including purge station heating means only at one of a pre-processing purge station and a post-processing purge station may be adopted.

Purge station heating means can be implemented by an air-conditioner which warms the interior of a purge station instead of or in addition to a configuration which warms a rack or a stage itself where a wafer can be placed by directly providing a heater such as a hot wire at the rack or stage where a wafer can be placed. Even in the former case, a degassing effect resulting from a thermal phoresis phenomenon can be expected by subjecting a wafer transported into the purge station to a heater gaseous atmosphere. As purge station heating means, a configuration which heats a wafer by applying light to the wafer by a hot wire lamp may be adopted.

Depending on conditions such as an installation area, a wafer transport apparatus may not include one or both of a pre-processing purge station and a post-processing purge station. Note that a purge station only needs to be capable of replacing a gaseous atmosphere in the purge station with nitrogen or dry air and may be required to include an appropriate evacuation section.

It is also possible to construct a wafer transport apparatus in which wafer transport robot heating means is mounted on at least one of an in-carrying-in-chamber wafer transport robot and an in-carrying-out-chamber wafer transport robot and construct a wafer transport apparatus in which wafer transport robot heating means is mounted on neither of an in-carrying-in-chamber wafer transport robot and an in-carrying-out-chamber wafer transport robot.

The number of load lock stages to be provided in each load lock (a carrying-in load lock or a carrying-out load lock) may be not less than three or may be one. It is also possible to construct a wafer transport apparatus including a plurality of carrying-in load locks and a plurality of carrying-out load locks. In this case, the carrying-in load locks and carrying-out load locks may be alternately provided in a height direction.

Although a configuration in which a carrying-in chamber and a carrying-out chamber are separated from each other by a common partition has been illustrated in the above-described embodiment, a carrying-in chamber and a carrying-out chamber may also be separated from each other by separate partitions.

A wafer carrying-in port of a carrying-in load lock which is capable of communicating with the semiconductor processing chamber side and a wafer carrying-out port of a carrying-out load lock which is capable of communicating with the semiconductor processing chamber side may be set to have different orientations.

In an in-processing-chamber wafer transport robot provided in a semiconductor processing chamber, a common blade may be used as a blade which can access a carrying-in load lock from the semiconductor processing chamber side and a blade which can access a carrying-out load lock from the semiconductor processing chamber side. Alternatively, it is also possible to employ a configuration in which an in-processing-chamber wafer transport robot capable of accessing a carrying-in load lock and an in-processing-chamber wafer transport robot capable of accessing a carrying-out load lock are separately provided in a semiconductor processing chamber.

The specific configuration of each section is not limited to the above embodiment, and various modifications can be made without departing from the scope of the present invention.

What is claimed is:

1. A wafer transport apparatus for carrying an unprocessed wafer into a semiconductor manufacturing processing apparatus and carrying out a processed wafer from the semiconductor manufacturing processing apparatus, comprising a carrying-in load port, a carrying-in chamber, a carrying-in load lock, a carrying-out chamber, a carrying-out load port, and a carrying-out load lock, the carrying-in load port being capable of being loaded with a FOUP storing the unprocessed wafer, the carrying-in chamber placing the carrying-in load port arranged at a front surface and having an in-carrying-in-chamber wafer transport robot provided in an internal space which takes out the unprocessed wafer from the FOUP on the carrying-in load port, the carrying-in load lock being arranged between the carrying-in chamber and the semiconductor manufacturing processing apparatus and being accessible by the in-carrying-in-chamber wafer transport robot from the carrying-in chamber side, the carrying-out load port being capable of being loaded with a FOUP which can store the processed wafer, the carrying-out chamber placing the carrying-out load port at a front surface and having an in-carrying-out-chamber wafer transport robot provided in an internal space which passes the processed wafer to the FOUP on the carrying-out load port, the carrying-out load lock being arranged between the carrying-out chamber and the semiconductor manufacturing processing apparatus and being accessible by the in-carrying-out-chamber wafer transport robot from the carrying-out chamber side, wherein the carrying-in chamber and the carrying-out chamber are arranged adjacent to each other, and separated from each other by a partition, and the carrying-in load lock and the carrying-out load lock are vertically arranged at positions overlapping with each other on different stages, the carrying-in load lock includes an openable/closable carrying-in chamber side opening which the in-carrying-in chamber wafer transport robot can access, and faces only the carrying-in chamber, the carrying-out load lock includes an openable/closable carrying-out chamber side opening which the in-carrying-out chamber wafer transport robot can access, and faces only the carrying-out chamber, wherein the openable/closable carrying-in chamber side opening and the openable/closable carrying-out chamber side opening are disposed at an obtuse angle to the partitions which separate carrying-in and carrying out chambers.

2. The wafer transport apparatus according to claim 1, wherein the carrying-in load lock includes a wafer carrying-in port capable of communicating with a semiconductor processing chamber arranged at a back surface, the carrying-out load lock includes a wafer carrying-out port capable of communicating with the semiconductor processing chamber arranged at the back surface, and the wafer carrying-in port and the wafer carrying-out port are set to have the same orientation.

3. The wafer transport apparatus according to claim 1, further comprising an in-processing-chamber wafer transport robot arranged in the semiconductor processing chamber, wherein the in-processing-chamber wafer transport robot includes an unprocessed wafer transport blade which can access an interior of the carrying-in load lock and a processed wafer transport blade which can access an interior of the carrying-out load lock.

4. The wafer transport apparatus according to claim 1, wherein a purge station which can replace a gaseous atmosphere in the FOUP with nitrogen or dry air is arranged adjacent to at least one of the carrying-in chamber and the carrying-out chamber.

* * * * *